(12) United States Patent
Baselmans et al.

(10) Patent No.: US 9,791,787 B2
(45) Date of Patent: Oct. 17, 2017

(54) LITHOGRAPHIC METHOD AND APPARATUS

(71) Applicant: ASML Netherlands B.V., Veldhoven (NL)

(72) Inventors: Johannes Jacobus Matheus Baselmans, Oirschot (NL); Johannes Christiaan Maria Jasper, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/934,623

(22) Filed: Nov. 6, 2015

(65) Prior Publication Data

US 2016/0062243 A1     Mar. 3, 2016

Related U.S. Application Data

(60) Continuation of application No. 13/767,774, filed on Feb. 14, 2013, now Pat. No. 9,304,411, and a
(Continued)

(51) Int. Cl.
*G03F 7/20* (2006.01)

(52) U.S. Cl.
CPC .............. *G03F 7/705* (2013.01); *G03F 7/706* (2013.01); *G03F 7/70058* (2013.01); *G03F 7/70141* (2013.01); *G03F 7/70891* (2013.01)

(58) Field of Classification Search
None
See application file for complete search history.

(56) References Cited

U.S. PATENT DOCUMENTS

| 5,424,552 A | 6/1995 | Tsuji et al. |
| 5,801,815 A | 9/1998 | Takahashi |

(Continued)

FOREIGN PATENT DOCUMENTS

| JP | 09-063948 A | 3/1997 |
| JP | 11-260712 A | 9/1999 |

(Continued)

OTHER PUBLICATIONS

Moest, B., et al., "Optimized reticle alignment structures for minimizing aberration sensitivities and pattern shifts," Proceedings of SPIE—Photomask Technology 2010, vol. 7823, Sep. 2010; pp. 78233J-1 to 78233J-12.

(Continued)

*Primary Examiner* — Steven H Whitesell Gordon
(74) *Attorney, Agent, or Firm* — Sterne, Kessler, Goldstein & Fox P.L.L.C.

(57) ABSTRACT

A method of patterning substrates using a lithographic apparatus. The method comprising providing a beam of radiation using an illumination system, using a patterning device to impart the radiation beam with a pattern in its cross-section, and using a projection system to project the patterned radiation beam onto target portions of a lot of substrates, wherein the method further comprises performing a radiation beam aberration measurement after projecting the patterned radiation beam onto a subset of the lot of substrates, performing an adjustment of the projection system using the results of the radiation beam aberration measurement, then projecting the patterned radiation beam onto a further subset of the lot of substrates.

20 Claims, 3 Drawing Sheets

Figure 1:
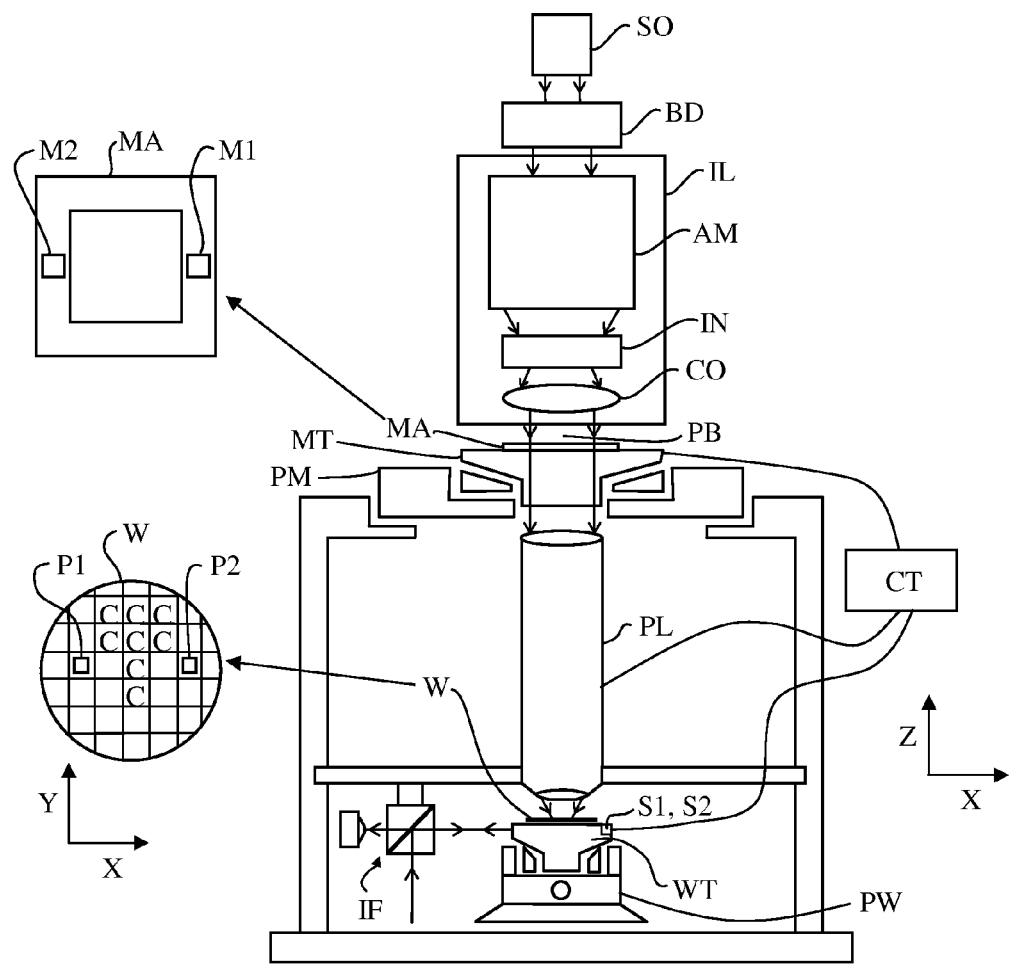

Related U.S. Application Data continuation of application No. 14/825,771, filed on Aug. 13, 2015, which is a division of application No. 13/767,774.

(60) Provisional application No. 61/607,758, filed on Mar. 7, 2012.

(56) References Cited

U.S. PATENT DOCUMENTS

| | | | |
|---|---|---|---|
| 6,088,082 A * | 7/2000 | Yonekawa | G03F 7/70216 355/53 |
| 6,208,469 B1 | 3/2001 | Matsuura | |
| 6,563,564 B2 | 5/2003 | de Mol et al. | |
| 6,788,383 B1 | 9/2004 | Jeunink et al. | |
| 7,080,330 B1 | 7/2006 | Choo et al. | |
| 7,403,264 B2 | 7/2008 | Jeunink et al. | |
| 8,428,763 B2 | 4/2013 | Kanda | |
| 9,134,631 B2 | 9/2015 | Kuit et al. | |
| 9,304,411 B2 | 4/2016 | Baselmans et al. | |
| 2004/0090606 A1 | 5/2004 | Ishikawa | |
| 2005/0010878 A1 | 1/2005 | Blatchford et al. | |
| 2005/0206850 A1 | 9/2005 | Shimizu et al. | |
| 2006/0055904 A1 | 3/2006 | Baselmans | |
| 2006/0114437 A1* | 6/2006 | Akhssay | G03F 7/70258 355/55 |
| 2007/0211233 A1 | 9/2007 | Van de Kerkhof et al. | |
| 2008/0220345 A1 | 9/2008 | Van de Kerkhof et al. | |
| 2008/0278698 A1 | 11/2008 | Kazinczi et al. | |
| 2008/0316448 A1* | 12/2008 | Ohsaki | G03F 7/70566 355/53 |
| 2009/0009742 A1 | 1/2009 | Arai | |
| 2009/0028421 A1 | 1/2009 | Sukegawa | |
| 2010/0171939 A1 | 7/2010 | Baselmans et al. | |
| 2011/0181855 A1 | 7/2011 | Bittner et al. | |
| 2013/0235361 A1 | 9/2013 | Baselmans et al. | |
| 2015/0346606 A1 | 12/2015 | Baselmans et al. | |

FOREIGN PATENT DOCUMENTS

| | | |
|---|---|---|
| JP | 2000-124104 A | 4/2000 |
| JP | 2006-024941 A | 1/2006 |
| JP | 2008-283178 | 11/2008 |
| JP | 2009-231832 | 10/2009 |

OTHER PUBLICATIONS

Van De Kerkhof, M., et al., "Full optical column characterization of DUV lithographic projection tools," Proceedings of SPIE—Optical Microlithography XVII, vol. 5377, 2004; pp. 1960-1970.

English-Language Abstract for Japanese Patent Publication No. 11-260712 A, published Sep. 24, 1999; 1 page.

Non-Final Rejection mailed Mar. 4, 2015 for U.S. Appl. No. 13/767,774, filed Feb. 14, 2013; 11 pages.

Notice of Allowance mailed Jul. 2, 2015 for U.S. Appl. No. 11/767,774, filed Feb. 14, 2013; 7 pages.

Notice of Allowance mailed Dec. 17, 2015 for U.S. Appl. No. 13/767,774, filed Feb. 14, 2013; 8 pages.

Non-Final Rejection mailed Oct. 13, 2016 for U.S. Appl. No. 14/825,771, filed Aug. 13, 2015; 9 pages.

Non-Final Rejection dated Jun. 27, 2017 for U.S. Appl. No. 14/825,771, filed Aug. 13, 2015; 11 pages.

* cited by examiner

LITHOGRAPHIC METHOD AND APPARATUS

This application incorporates by reference in their entireties U.S. patent application Ser. No. 13/767,774, filed Feb. 14, 2013, U.S. patent application Ser. No. 14/825,771, filed Aug. 13, 2015 and U.S. provisional application 61/607,758, filed Mar. 7, 2012.

FIELD OF THE PRESENT INVENTION

The present invention relates to a lithographic method and apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

BRIEF SUMMARY

Therefore, it is desirable to provide, for example, a lithographic method which provides an improved throughput or availability compared with at least some known lithographic methods.

According to a first aspect of the present invention, there is provided a method of patterning substrates using a lithographic apparatus, the method comprising providing a beam of radiation using an illumination system, using a patterning device to impart the radiation beam with a pattern in its cross-section, and using a projection system to project the patterned radiation beam onto target portions of a lot of substrates, wherein the method further comprises performing a radiation beam aberration measurement after projecting the patterned radiation beam onto a subset of the lot of substrates, performing an adjustment of the projection system using the results of the radiation beam aberration measurement, then projecting the patterned radiation beam onto a further subset of the lot of substrates.

The method may further comprise, after projecting the patterned radiation beam onto the further subset of the lot of substrates, again performing a radiation beam aberration measurement, performing an adjustment of the projection system using the results of the additional radiation beam aberration measurement, then projecting the patterned radiation beam onto a further subset of the lot of substrates.

The radiation beam aberration measurement may include measurement of third order Zernike polynomial properties of the projected radiation beam.

The radiation beam aberration measurement may comprise performing measurements of the projected radiation beam at a series of locations which extend along an exposure slit formed by the radiation beam.

The number of substrates in the subset of the lot of substrates may be 10 or less. The number of substrates in the subset of the lot of substrates may be 5 or less.

The number of substrates in the subset of the lot of substrates may be selected by a user of the lithographic apparatus prior to exposure of the lot of substrates.

The method may be performed for a plurality of subsets, each subset of the plurality of subsets having the same number of substrates.

Optionally, feed-forward correction based on a lens heating model is not used to adjust the projection system during exposure of the lot of substrates.

Optionally, feed-forward correction based on a lens heating model generated using a different patterning device is used to adjust the projection system during exposure of the lot of substrates.

The method may further comprise using the results of the radiation beam aberration measurement to determine the accuracy of the lens heating model which is being used.

According to a second aspect of the present invention there is provided a method of patterning substrates using a lithographic apparatus, the method comprising providing a beam of radiation using an illumination system, using a patterning device to impart the radiation beam with a pattern in its cross-section, and using a projection system to project the patterned radiation beam onto target portions of a plurality of lots of substrates, wherein the method further comprises, after the patterned radiation has been projected onto a lot of substrates, determining whether a radiation beam aberration measurement and adjustment of the projection system using the results of the radiation beam aberration measurement is required, and then projecting the patterned radiation beam onto a next lot of substrates without performing the radiation beam aberration measurement and adjustment if it has been determined that the radiation beam aberration measurement and adjustment is not required.

The determination of whether a radiation beam aberration measurement and adjustment is required may take into account elapsed time since a previous radiation beam aberration measurement and adjustment.

The determination of whether a radiation beam aberration measurement and adjustment is required may take into account whether or not an illumination mode of the radiation beam has changed since the previous radiation beam aberration measurement and adjustment.

The determination of whether a radiation beam aberration measurement and adjustment is required may take into account whether or not the polarisation of the radiation beam has changed since the previous radiation beam aberration measurement and adjustment.

According to a third aspect of the present invention there is provided a lithographic apparatus comprising an illumination system for providing a beam of radiation, a support structure for supporting patterning device, the patterning device serving to impart the radiation beam with a pattern in its cross-section, a substrate table for holding a substrate, and a projection system for projecting the patterned radiation beam onto a target portion of the substrate, wherein the lithographic apparatus further comprises a controller configured to operate the lithographic apparatus according to the method of the first or second aspects of the present invention.

According to a fourth aspect of the present invention there is provided a program comprising machine readable instructions configured to cause a controller to carry out a method according the first or second aspects of the present invention.

According to a fifth aspect of the present invention there is provided a machine readable medium carrying a program according to the fourth aspect of the present invention.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

FIG. 1 depicts a lithographic apparatus according to an embodiment of the present invention.

Figure 2:
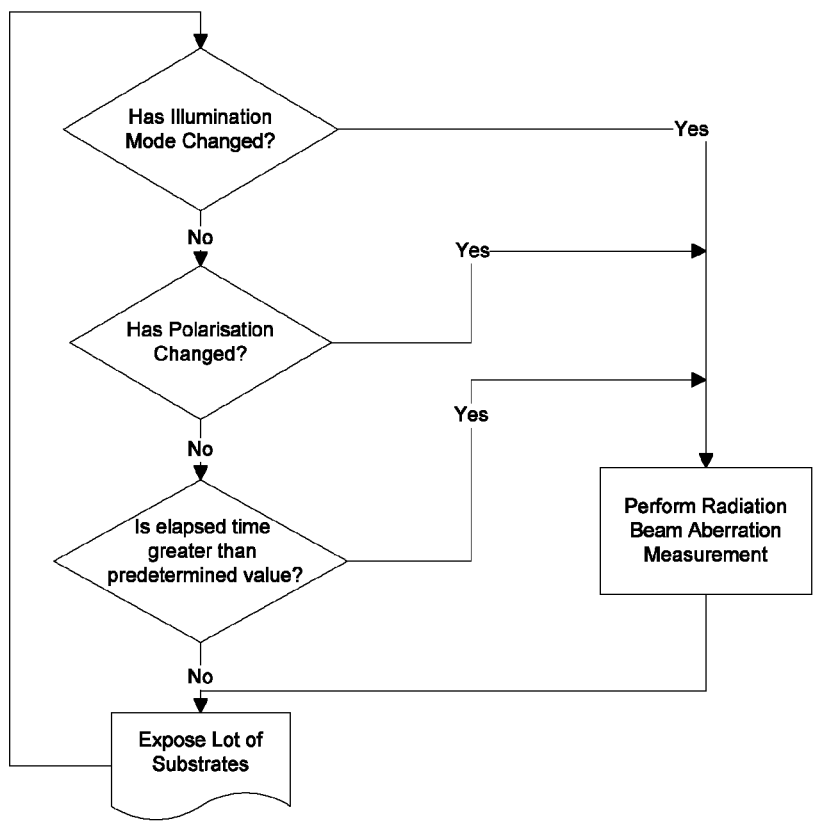

FIG. 2 schematically depicts a method according to an embodiment of the present invention.

Figure 3:
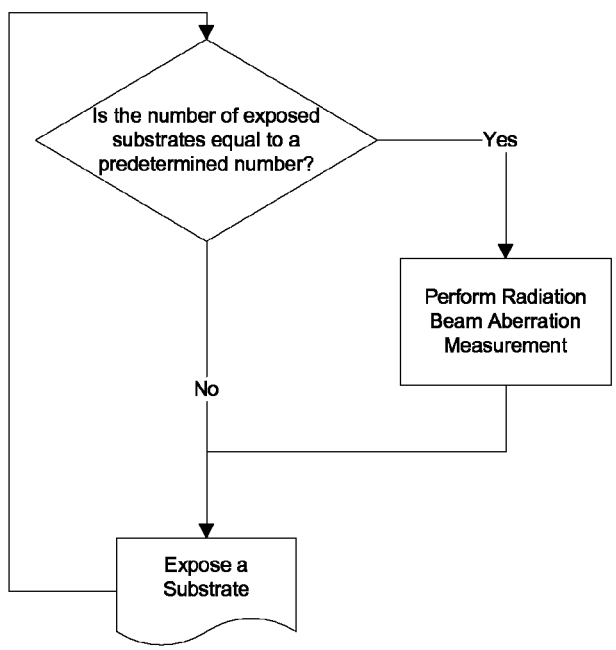

FIG. 3 schematically depicts a method according to an alternative embodiment of the present invention.

Figure 4:
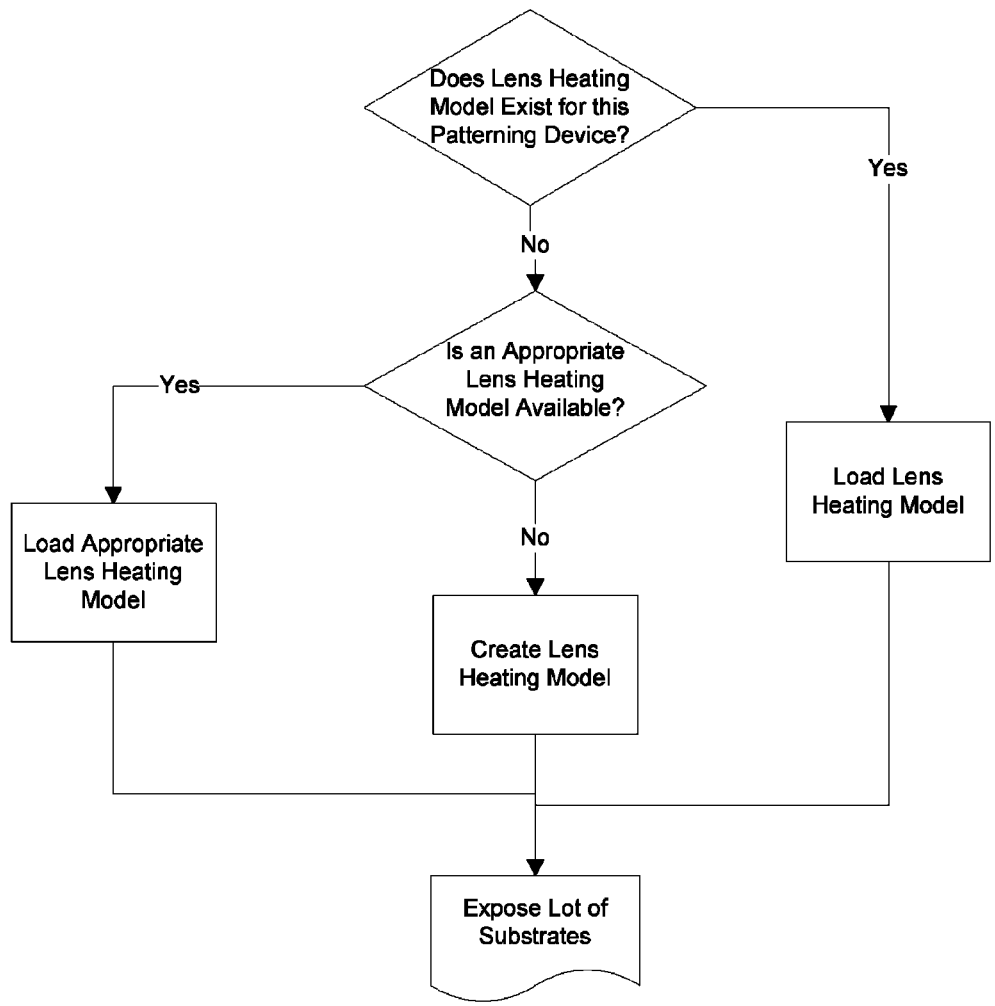

FIG. 4 schematically depicts a lithographic method.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion techniques are well known in the art for increasing the numerical aperture of projection systems.

FIG. 1 schematically shows a lithographic apparatus LAP including a source collector module SO according to an embodiment of the present invention. The apparatus comprises: an illumination system (illuminator) IL configured to condition a radiation beam B (e.g., EUV radiation); a support structure (e.g., a mask table) MT constructed to support a patterning device (e.g., a mask or a reticle) MA and connected to a first positioner PM configured to accurately position the patterning device; a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

As here depicted, the apparatus is of a transmissive type (e.g., employing a transmissive mask). Alternatively, the apparatus may be of a reflective type (e.g., employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device (e.g., mask) MA, which is held on the support structure MT. Having traversed the patterning device MA, the beam PB passes through the lens PL, which focuses the beam onto a target portion C of the substrate W. With the aid of the second positioning device PW and position sensor IF (e.g., an interferometric device), the substrate table WT can be moved accurately, e.g., so as to position different target portions C in the path of the beam PB. Similarly, the first positioning device PM and another position sensor (which is not explicitly depicted in FIG. 1) can be used to accurately position the patterning device MA with respect to the path of the beam PB, e.g., after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

Two sensors S1, S2 are provided on the substrate table WT (the sensors are represented in FIG. 1 by a single block). The first sensor S1 may be an imaging sensor (although other forms of sensor may be used) and may be configured to measure alignment of the substrate table WT relative to the patterning device MA. Measurement of alignment using such a sensor is described for example in "Optimized reticle alignment structures for minimizing aberration sensitivities and pattern shifts", Barry Moest, Mark van de Kerkhof, and Haico Kok, Proc. SPIE 7823, 78233J (2010), which is herein incorporated by reference in its entirety. The second sensor S2 may be an interferometer (although other forms of sensor may be used) which is configured to measure phase of the radiation beam PB projected by the projection system PL, thereby allowing aberrations of the radiation beam to be measured. Measurement of radiation beam aberrations using such a sensor is described for example in "Full optical column characterization of DUV lithographic projection tools," Mark A. van de Kerkhof, Wim de Boeij, Haico Kok, Marianna Silova, Jan Baselmans, and Marcel Hemerik, Proc. SPIE 5377, 1960 (2004), which is herein incorporated by reference in its entirety.

A controller CT is connected to the first and second sensors S1, S2, to the projection system PL, to the substrate table WT and to the mask table MT. The controller CT is operative, in response to measurements made by the first sensor S1 to adjust the position of the substrate table WT and/or the position of the patterning device MA. The controller is operative, in response to measurements made by the second sensor S2, to adjust the projection system PL in order to modify properties of the radiation beam PB projected by the projection system. The controller CT may for example be operable to adjust individual lenses of the projection system PL using actuators (not shown). Although two sensors S1, S2 are shown in FIG. 1, any number of sensors may be provided. In some instances, a single sensor may be used to provide all of the measurements referred to above.

The depicted apparatus can be used in the following preferred modes:

1. In step mode, the support structure MT and the substrate table WT are kept essentially stationary, while an entire pattern imparted to the beam PB is projected onto a target portion C in one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e., a single dynamic exposure). The velocity and direction of the substrate table WT relative to the support structure MT is determined by the (de-) magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In a conventional lithographic apparatus, alignment measurements may be performed using the first sensor S1 prior to exposure of each substrate W. The alignment measurements may measure alignment of the patterning device MA and the substrate W, for example in the x and y directions as denoted in FIG. 1. In addition the alignment measurements may measure the best focus of the substrate W, i.e., the position of the substrate in the z-direction relative to a plane in which the sharpest aerial image of the patterning device MA is expected to be formed. Taken together, these measurements may be referred to as measurement of the aligned x, y and z position.

The position of the substrate W in the x, y and z directions may be adjusted to take account of the alignment measurements. The position of the patterning device MA may also be adjusted. The substrate is then exposed, following which another substrate is placed on the substrate table WT. The alignment measurements may once again be performed by the sensor S, and adjustments to the x, y and z positions may be performed prior to exposure of that substrate.

Additional measurements may be performed using the second sensor S2 prior to exposure of a lot of substrates (e.g., after exposure of a previous lot of substrates). The lot of substrates may for example be 25 substrates, as this is the number of substrates which may be carried using a conventional substrate carrier. The lot may be a smaller number than this, for example if the production run for a given product requires less than 25 substrates. The number of substrates in the lot could be larger than 25 (for example if a substrate carrier capable of carrying more than 25 substrates were to be used).

The measurements performed prior to exposure of a lot of substrates may be performed using the second sensor S2. The measurements may measure aberrations of the radiation beam PB after projection by the projection system PL. Radiation beam aberration measurements may for example be performed at a series of locations which extend along an exposure slit formed by the radiation beam (the exposure slit being the area of radiation provided by a scanning lithographic apparatus). For example, using the Cartesian notation shown in FIG. 1, measurements may be made at different x-direction positions along the exposure slit (the y-direction being the scanning direction).

The radiation beam aberration measurements may for example include measurements of third order Zernike polynomial properties of the projected radiation beam PB, and may measure higher order Zernike polynomial properties of the projected radiation beam. For example, Zernike polynomials up to order 25 may be measured. For example, Zernike polynomials up to order 64, or more, may be measured. The aberration measurements provide detailed information regarding the imaging performance of the projection system PL. Using this information the controller CT may adjust lenses of the projection system PL in order to improve the imaging performance of the projection system (e.g., using previously determined correspondence between lens adjustments and projected image modification). The controller CT may adjust lenses of the projection system PL to reduce aberrations introduced into the radiation beam by the projection system.

A problem associated with performing radiation beam aberration measurements and associated adjustments prior to exposure of each lot is that the measurement and adjustment may take a significant amount of time (e.g., 10-15 seconds). A further problem is that in some instances significant changes may occur within the projection system PL due to lens heating during the time interval between radiation beam aberration measurements (e.g., 8-15 minutes). As a result of these changes within the projection system PL, images which are projected onto a substrate W may not be formed correctly.

In order to overcome or mitigate the above disadvantages, a model which models how lens heating affects the projection system PL during exposure of the substrate W may be generated. The lens heating model may be used to perform adjustments of the projection system PL during exposure of a lot of wafers. This may be referred to as model-based intra-lot projection system adjustment.

The lens heating model may for example be generated for a given patterning device MA and lithographic apparatus combination by directing the radiation beam PB through that patterning device and through the projection system PL to generate images at the substrate table WT, and measuring properties of the radiation beam after exposure of each image. The measurements of the radiation beam may be radiation beam aberration measurements, which may for example be performed at a series of locations which extend along the exposure slit formed by the radiation beam. The radiation beam aberrations may for example be measured using the second sensor S2. The measured radiation beam aberrations are used to generate the lens heating model.

Generating the lens heating model may be relatively time consuming, and may for example require in excess of one hour (e.g., one and a half hours). This is because it may be necessary to allow the projection system PL to cool (e.g., following exposure using other patterning devices) before the measurements may be made, because the lens heating model may need to model changes of the projection system starting from a relatively cold lens heating state (i.e., an initial state in which little or no heating of the projection system lenses due to the radiation beam has occurred). In some instances a production run using a given patterning device MA may comprise a small number of lots (e.g., one or two lots), or may comprise less than one lot (e.g., less than 25 substrates). Where this is the case, the time needed to generate the lens heating model may be of a similar order to or greater than the time taken to expose the substrates. Generation of the lens heating model thus has a substantial impact upon the availability of the lithographic apparatus in these circumstances.

Embodiments of the present invention may address one or more of the above disadvantages.

A first embodiment of the present invention is shown schematically as a process flow in FIG. 2. In this embodiment, after each lot of substrates has been exposed a determination is made regarding whether or not radiation beam aberration measurement and adjustment are required (e.g., measurement of third and possibly higher order Zernike polynomials and consequent corrections). If it is determined that radiation beam aberration measurement and adjustment are not required then these measurement and adjustment are not performed. This may provide a saving of for example 10-15 seconds, thereby providing an increase of the throughput of the lithographic apparatus.

A user of the lithographic apparatus may, via an input device (not shown), indicate that radiation beam aberration measurement and adjustment are to be skipped when it is determined that they are not required. Where this is the case, the controller CT will skip radiation beam aberration measurement and adjustment provided that predetermined criteria are satisfied.

One of the criteria may for example be that the illumination mode used by the lithographic apparatus has not changed since the previous radiation beam aberration measurement and adjustment. The illumination mode may change for example if the patterning device MA is changed for a different patterning device. If the illumination mode has changed, the request to skip radiation beam aberration measurement and adjustment may be overruled and radiation beam aberration measurement and adjustment performed. This may be desirable because a different illumination mode will use the projection system PL differently, and the impact of lens heating on the projected radiation beam will therefore be different.

One of the criteria may for example be that the polarization of the radiation beam has not changed since the previous radiation beam aberration measurement and adjustment. If the radiation beam polarization has changed, the request to skip radiation beam aberration measurement and adjustment may be overruled and radiation beam aberration measurement and adjustment performed. This may be desirable because the projection system PL will apply different aberrations to the radiation beam when a different polarization is used.

One of the criteria may for example be the elapsed time since the previous radiation beam aberration measurement and adjustment. For example, if the elapsed time since the previous radiation beam aberration measurement and adjustment is greater than one hour (or some other period), then a request to skip radiation beam aberration measurement and adjustment would be overruled and radiation beam aberration measurement and adjustment would be performed.

In some instances a very large number of lots of the same pattern may be exposed onto substrates. For example, when manufacturing memory devices many thousands of substrates may be exposed by a given lithographic apparatus in a given production run. Where this is the case, a temperature distribution within lenses of the projection system PL may stabilise such that little or no further changes of the temperature distribution occur. Consequently, little or no change of the images projected by the projection system PL will occur between lots. In situations such as these, radiation beam aberration measurement and adjustment may be skipped after exposure of some lots. The above time-based criterion may be used to ensure that aberration measurement and adjustment are performed periodically (e.g., hourly).

One or more other criteria may be used in addition to or instead of the above criteria. The criteria may be ones which allow a determination of whether or not skipping radiation beam aberration measurement and adjustment after exposure of a lot of substrates would give rise to unacceptable errors in images projected onto the next lot of substrates. Embodiments of the present invention may thus allow radiation beam aberration measurement and adjustment to be skipped provided that this will not give rise to unacceptable errors in projected images, thereby providing an increase of throughput.

In an alternative embodiment, a production run of substrates may be performed without generating a lens heating model for exposure of those substrates. This may be done for example in situations in which the time required to generate the lens heating model is of a similar order to or greater than the time required to expose the substrates.

FIG. 3 schematically shows a process flow according to this embodiment of the present invention. As may be seen, the process includes a decision point after exposure of each substrate where it is determined whether or not radiation beam aberration measurement and adjustment should be performed. Because no lens heating model has been generated, lens heating may have a significant detrimental effect upon the quality of images projected onto substrates of a lot (the effects of lens heating are not compensated for by a lens heating model). In order to reduce the effect of this lens heating, radiation beam aberration measurement and adjustment are performed during exposure of a lot of substrates (i.e., without waiting for exposure of the lot to be completed). For example, a radiation beam aberration measurement and adjustment may be performed after exposure of the $5^{th}$, $10^{th}$, $15^{th}$, $20^{th}$ and $25^{th}$ substrates of a lot, thereby allowing correction of lens heating effects to be performed after each five substrates have been exposed. The radiation beam aberration measurement and adjustment may be performed after other numbers of substrates have been exposed.

The time required to perform the radiation beam aberration measurement and adjustment is significantly less than the time that would have been required to generate the lens heating model (assuming that for example less than around 60 lots are exposed in this embodiment). An improvement of the availability of the lithographic apparatus is thus provided.

The determination of whether or not radiation beam aberration measurement and adjustment should be performed may be made by the controller CT (see FIG. 1) after exposure of each substrate W. This determination may be made based upon information which has previously been input into the lithographic apparatus by a user. For example, the user may specify after which substrates of a production run radiation beam aberration measurement and adjustment are to be performed (e.g., after every $4^{th}$ substrate, every $5^{th}$ substrate, or some other number). The controller CT compares the number of a substrate to be exposed with the instructions input by the user, and performs radiation beam aberration measurement and adjustment if the substrate has a number which corresponds with a number provided by the user.

In an embodiment, radiation beam aberration measurement and adjustment may be performed after equal numbers of substrates (e.g., after every $5^{th}$ substrate). In an alternative embodiment, the number of substrates between radiation beam aberration measurement and adjustment may vary. For example, the number of substrates between radiation beam aberration measurement and adjustment may increase as the number of exposed substrates increases. This may take into account for example that as the number of exposed substrates increases the extent to which lens heating modifies the projected image reduces (the temperature of the lenses tends to stabilise over time).

In an alternative embodiment, the controller CT may determine whether a feed-forward correction based on a lens heating model for adjusting the projection system during exposure of a lot of substrates is required. This determination may take into account a number of subsequent lots that will be exposed. If a production runs comprises a small number of lots (e.g. one or two lots), it will be more time consuming to generate a lens heating model for that production run than it will be to perform regular radiation beam aberration measurements throughout the production run. If a production runs comprises a large number of lots, it will be more time consuming to perform regular radiation beam aberration measurements throughout the production run than it will be to generate a lens heating model for the production run. The determination whether a feed-forward correction based on a lens heating model is required may take into account a time required to generate the lens heating model.

In an embodiment, upon the controller having determined that no feed-forward correction is required, a radiation beam aberration measurement may be performed after exposing a subset of the lot of substrates, followed by an adjustment of the projection system using the results of the radiation beam aberration measurement, after which a further subset of the lot is exposed. In an embodiment, instead of generating a new lens heating model for a new patterning device MA, an existing lens heating model may be used. The existing lens heating model may be one which has previously been generated using the same lithographic apparatus, for example with the same illumination mode, the same field size and the same layer number (i.e., the number of layers which have already been exposed onto the substrate). For example, in a foundry a particular way of imaging patterns using lithographic apparatus may be used. This particular way of imaging may be used for patterning devices bearing a variety of different patterns. For example, the same optical proximity correction features may be used, the same illumination mode or a similar illumination mode may be used, and the same field size may be used. In addition, in a foundry the same number of layers may be used to form different devices. In some instances, a lens heating model which has previously been generated for a given lithographic apparatus for a given patterning device MA may be used when using that lithographic apparatus to expose substrates using a different patterning device. The controller CT may be configured to determine whether an existing lens heating model may be used for the feed-forward correction. In this determination, the controller CT may take into account whether the existing lens heating model has been generated on the same lithographic apparatus. Additionally or alternatively, the controller CT may take into account whether the existing lens heating model has been generated for a second method of patterning substrates having a process condition in common with the method of patterning substrates. The process condition may be on or more of an illumination mode, a field size, a layer number and the patterning device. Additionally or alternatively, other process conditions may be used for determining whether an existing lens heating model may be used.

In an embodiment, upon determining that a feed-forward correction is required, a radiation beam aberration measurement may be performed after projecting the patterned radiation beam onto a subset of the lot of substrates. The results of the radiation beam aberration measurement may be used to adjust the projection system before projecting the patterned radiation beam onto a further subset of the lot of substrates. Additionally, the results of the radiation beam aberration measurement may be used to determine the accuracy of the lens heating model which is being used. The lens heating model may be updated using the results of the radiation beam aberration measurement. The lens heating model of which the accuracy is being determined may be newly generated lens heating model or an existing lens heating model which has been generated for a second method of patterning substrates.

In an embodiment, the radiation beam aberration measurement may comprise performing measurements of the projected radiation beam at a series of locations which extend along an exposure slit formed by the radiation beam.

A process flow which may be performed according to this embodiment of the present invention is shown schematically in FIG. 4. As is indicated, the controller CT (see FIG. 1) may, on determining that a new patterning device MA is to be used to expose substrates, first check to see whether a lens heating model has previously been generated for that patterning device. If a lens heating model has indeed been generated for that patterning device MA, then this lens heating model is used during the exposure of the substrates with that patterning device. If a lens heating model has not previously been generated for that patterning device MA then a lens heating model generated previously for a different patterning device may be used. The controller CT checks to see whether an appropriate lens heating model is available (e.g., using criteria set out further below). If an appropriate lens heating model is available, then this lens heating model is used. If an appropriate lens heating model is not available, then a new lens heating model is generated. The new lens heating model is then used during exposure of the substrates.

Identification of an appropriate lens heating model may be for example on the basis of identifiers which are recorded by a user against previously generated lens heating models. An identifier for a lens heating model may for example be based upon the illumination mode, field size and layer number used when that lens heating model was generated. Thus, when a new patterning device MA is to be used, a lens heating model generated using a different patterning device but for the same illumination mode, field size and layer number may be selected for use in conjunction with that new patterning device.

In an alternative approach, a lens heating model may be allocated a character string in which different characters are indicative of properties that applied when that lens heating model was generated. For example, a first character could indicate the illumination mode, a second character the field size, and a third character the layer number. The remaining characters of the string could identify the patterning device MA that was used when generating the lens heating model. When searching for a lens heating model for a patterning device MA, the controller CT may first use all of the characters of the character string, including the characters which identify the patterning device, in order to find the lens heating model previously generated for that patterning device if that lens heating model exists. If that lens heating model does not exist then the controller CT may search the lens heating models by replacing the patterning device identifying characters with a wild card, so that an appropriate lens heating model is found (e.g., with the correct illumination mode, field size and layer number). This lens heating model may then be used when exposing substrates using the patterning device.

Selection of an appropriate lens heating model may be limited to selection from lens heating models which have previously been generated using the lithographic apparatus which is to perform the exposures using the patterning device MA. Alternatively, selection of an appropriate lens heating model may be expanded to include lens heating models which have previously been generated using other lithographic apparatus (e.g., limited to lithographic apparatus which have the same design of projection system PL). The selection of a lens heating model from models which have previously been generated using other lithographic apparatus may be limited to models in which relatively small aberrations are seen. If relatively large aberrations are expected, then the selection of a lens heating model may be limited to models which have previously been generated using the same lithographic apparatus. This is because in such circumstances small differences between the modelled aberrations and the actual aberrations (which could be seen if the model were generated using a different lithographic apparatus) may have a large effect upon the accuracy of patterns projected during substrate exposures.

In an embodiment, an intra-lot radiation beam aberration measurement and adjustment may be performed when an appropriate lens heating model is being used during exposure of a lot of substrates (i.e., a lens heating model which was not generated using the patterning device MA which is being used for the exposures). The lens heating model which is being used will be less accurate than would be the case if the lens heating model had been generated using the patterning device MA which is being used for the exposures. Consequently, performing a radiation beam aberration measurement and adjustment after exposure of part of the lot of substrates (e.g., after exposure of 10 substrates) may provide a significant improvement of the accuracy with which the pattern is projected onto later substrates of the lot.

The results of intra-lot radiation beam aberration measurement and adjustments (and inter-lot radiation beam measurement and adjustments) may be used to determine the accuracy of the lens heating model which is being used.

The alignment, focus and demagnification measurements, and the radiation beam aberration measurements (together with consequent adjustments of the lithographic apparatus) may be considered to be examples of feedback. The lens heating model (together with consequent adjustments of the lithographic apparatus) may be considered to be an example of feed forward correction.

It will be appreciated that aspects of the present invention can be implemented in any convenient way including by way of suitable hardware and/or software. For example, a device arranged to implement the present invention may be created using appropriate hardware components. Alternatively, a programmable device may be programmed to implement embodiments of the present invention. The present invention therefore also provides suitable computer programs for implementing aspects of the present invention. Such computer programs can be carried on suitable carrier media including tangible carrier media (e.g., hard disks, CD ROMs and so on) and intangible carrier media such as communications signals."

While specific embodiments of the present invention have been described above, it will be appreciated that the present invention may be practiced otherwise than as described. The description is not intended to limit the present invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method of patterning substrates, comprising:
   determining whether an adjustment to a projection system is needed based on a lens heating model;
   if adjustment is needed based on the determining, adjusting the projection system and
   projecting a patterned radiation beam onto target portions of a subset of a substrate lot using the adjusted projection system;
   if adjustment is not needed based on the determining, projecting a patterned radiation beam onto target portions of the subset of the substrate lot using the unadjusted projection system; and determining whether a radiation beam aberration measurement of the projection system is needed for a next lot of substrates.

2. The method of claim 1, further comprising:
verifying accuracy of the lens heating model based on the radiation beam aberration measurement.

3. The method of claim 1, wherein the determining whether a radiation beam aberration measurement of the projection system is needed takes into account a number of substrates exposed by the projection system that occur after: (a) a previous radiation beam aberration measurement or (b) a previous adjustment to the projection system.

4. The method of claim 1, further comprising:
determining whether the lens heating model needs to be replaced; and
if the lens heating model needs to be replaced, replacing the lens heating model.

5. The method of claim 4, wherein the updated lens heating model is based on a lithographic apparatus being used.

6. The method of claim 5, wherein the replacing takes into account whether the lens heating model was generated for another method of patterning substrates having a subset of a process condition in common with the method of patterning substrates.

7. The method of claim 4, wherein the replacing comprises generating a new lens heating model.

8. The method of claim 1, further comprising, when it has been determined that the radiation beam aberration measurement is needed:
measuring a radiation beam aberration after the projecting;
adjusting the projection system based on the measuring; and
projecting the patterned radiation beam onto a subset of the next substrate lot.

9. The method of claim 8, wherein the measuring aberration comprises measuring phase of the patterned radiation beam.

10. The method of claim 9, wherein the phase of the patterned radiation beam is measured using a phase measurement interferometer.

11. The method of claim 8, wherein the measuring uses an interferometer or a patterning device.

12. The method of claim 8, further comprising:
updating the lens heating model prior to the projecting based on the measuring.

13. The method of claim 1, wherein the lens heating model is modeled to predict effects of lens heating on the projection system.

14. The method of claim 1, wherein the adjusting comprises adjusting lenses in the projection system using an actuator.

15. The method of claim 1, wherein the determining whether a radiation beam aberration measurement of the projection system is needed takes into account elapsed time since a previous measuring of radiation beam aberration.

16. The method of claim 1, wherein the determining whether a radiation beam aberration measurement of the projection system is needed takes into account a number of substrates previously exposed since a previous measuring of radiation beam aberration.

17. The method of claim 1, wherein the determining whether a radiation beam aberration measurement of the projection system is needed takes into account whether a polarization of the patterned radiation beam has changed since a previous measuring of radiation beam aberration.

18. The method of claim 1, further comprising:
projecting the patterned radiation beam onto at least a subset of the next lot of substrates without performing the radiation beam aberration measurement when it has been determined that the radiation beam aberration measurement is not needed.

19. A lithographic apparatus comprising:
an illumination system configured to provide a radiation beam;
a support structure configured to support a patterning device, the patterning device imparting the radiation beam with a pattern;
a substrate table configured to hold a substrate;
a projection system configured to project the patterned radiation beam onto a target portion of the substrate; and
a controller configured to:
determine whether an adjustment to the projection system is needed based on a lens heating model;
adjust the projection system and project a patterned radiation beam onto target portions of a subset of a substrate lot using the adjusted projection system if adjustment is needed based on the determining;
project a patterned radiation beam onto target portions of the subset of the substrate lot using the unadjusted projection system if adjustment is not needed based on the determining; and
determine whether a radiation beam aberration measurement of the projection system is needed for a next lot of substrates.

20. The lithographic apparatus of claim 19, wherein the controller is further configured to:
project the patterned radiation beam onto at least a subset of the next lot of substrates without performing the radiation beam aberration measurement when it has been determined that the radiation beam aberration measurement is not needed.

* * * * *

UNITED STATES PATENT AND TRADEMARK OFFICE
CERTIFICATE OF CORRECTION

PATENT NO. : 9,791,787 B2
APPLICATION NO. : 14/934623
DATED : October 17, 2017
INVENTOR(S) : Baselmans et al.

Page 1 of 1

It is certified that error appears in the above-identified patent and that said Letters Patent is hereby corrected as shown below:

In the Claims

In Column 15, Lines 39-40, Claim 9, please delete "aberration".

Signed and Sealed this
Sixth Day of February, 2018

Joseph Matal
*Performing the Functions and Duties of the*
*Under Secretary of Commerce for Intellectual Property and*
*Director of the United States Patent and Trademark Office*